United States Patent [19]

Heuvel

[11] Patent Number: 5,612,620
[45] Date of Patent: Mar. 18, 1997

[54] INDUCTIVE PICKUP SENSOR WITH ENHANCED CROSS-TALK IMMUNITY

[75] Inventor: Johannes B. O. Heuvel, Losser, Netherlands

[73] Assignee: Fluke Corporation, Everett, Wash.

[21] Appl. No.: 623,388

[22] Filed: Mar. 27, 1996

[51] Int. Cl.$^6$ ..................................... F02P 17/00
[52] U.S. Cl. .......................... 324/402; 324/127; 324/392
[58] Field of Search ................................... 324/628, 127, 324/128, 132, 391–393, 402

[56] References Cited

U.S. PATENT DOCUMENTS

| 3,566,202 | 2/1971 | Carr | 361/270 |
|---|---|---|---|
| 3,961,240 | 6/1976 | Pohl | 324/402 X |
| 4,008,430 | 2/1977 | Blum | 324/402 |
| 4,041,373 | 8/1977 | Maringer | 324/402 |
| 4,146,833 | 3/1979 | McKinnon et al. | 324/391 |

Primary Examiner—Kenneth A. Wieder
Assistant Examiner—Diep Do
Attorney, Agent, or Firm—Douglas J. Barker

[57] ABSTRACT

An inductive pickup sensor employing an isolation transformer to achieve substantially improved immunity to capacitively-induced cross-talk signals is provided. A magnetic pickup coil is coupled to a spark plug wire to receive a spark signal. The spark signal developed across the magnetic pickup coil is then coupled to via a sensor cable to the primary winding of an isolation transformer which is configured to provide a relatively low interwinding capacitance level to substantially reduce the cross-talk signal amplitude relative to the spark signal at a detector circuit. The detector turns the spark signal into a trigger signal at a pair of output terminals.

3 Claims, 3 Drawing Sheets

INDUCTIVE PICKUP SENSOR WITH ENHANCED CROSS-TALK IMMUNITY

BACKGROUND OF THE INVENTION

This invention relates generally to sensors for instrument and in particular to an inductive pickup sensor for sensing high voltage pulses in an automotive ignition system.

Servicing internal combustion engines often requires test instruments that are synchronized to the engine in order to measure timing parameters. The most common method of obtaining this synchronization in engines that use high voltage ignition systems is to detect the high voltage pulse sent to the spark plug in a designated number one cylinder. Timing parameters such as "dwell angle" are typically measured relative to the spark in the number one cylinder for each particular engine.

Inductive pickup sensors for sensing high voltage pulses have been commercially available for a number of years. Inductive pickup sensors are comprised of a magnetic pickup coil which is typically coupled to a spark plug wire by clamping a jaw containing the magnetic pickup coil around the spark plug wire to produce a spark signal. The spark signal received by the magnetic pickup coil is coupled to a detector circuit which rectifies and low-pass filters the spark signal to provide a suitable trigger signal for the test instrument.

Within the engine compartment of a typical automobile, the set of spark plug wires (or "ignition cables") tend to be clustered closely together. During any given cycle of the automobile engine, the high voltage pulse may be in any one of the set of spark plug wires. Cross-talk from high voltage pulses in the spark plug wires other than the spark plug wire being monitored with the inductive pickup sensor may produce false trigger signals and thereby cause false or confusing readings from the test instrument. Such cross-talk is capacitively coupled into the inductive pickup sensor due to the close proximity of the inductive pickup sensor to the other spark plug wires and the relatively high field intensity induced by the high voltage pulse. Therefore, it would be desirable to provide an inductive pickup sensor that is substantially more immune to cross-talk that is capacitively induced from the high voltage pulse in adjacent spark plug wires.

SUMMARY OF THE INVENTION

In accordance with the present invention, an inductive pickup sensor employing an isolation transformer with low interwinding capacitance to achieve substantially improved immunity to capacitively-induced cross-talk is provided.

A magnetic pickup coil is coupled to a spark plug wire by encircling the spark plug wire with the magnetic core of the pickup coil. This is typically done using a mechanical jaw containing the sections of the magnetic core which are then clamped around the spark plug wire. The spark plug wire then acts as a primary winding and the magnetic pickup coil generates the spark signal in the manner of a secondary winding. The spark signal is then coupled to via a cable to the primary winding of an isolation transformer which is configured to provide a low interwinding capacitance level between the primary and secondary winding. The spark signal is then inductively coupled through the isolation transformer to a detector comprising a diode and low pass filter to develop a trigger signal at a pair of output terminals.

The inductive pickup sensor of the present invention has enhanced immunity to cross-talk induced by capacitive coupling from the set of adjacent spark plug wires comprising the cross-talk source by the addition of the isolation transformer. The cross-talk path from the cross-talk source is via capacitive coupling between the cross-talk source and the magnetic pickup coil and further via the interwinding capacitance between the primary and secondary windings of the isolation transformer. The insertion of the isolation transformer between the magnetic pickup coil and the detector adds a series capacitor to the cross-talk path which substantially reduces the effective capacitance of the total cross-talk path and thus reduces the level of capacitively-induced cross-talk signals present at the detector.

One object of the present invention is to provide an inductive pickup sensor with enhanced immunity to cross-talk signals.

Another object of the present invention is to provide an inductive pickup sensor with enhanced immunity to capacitively-coupled cross-talk signals.

An additional object of the present invention is to provide an inductive pickup sensor with enhanced immunity to capacitively-coupled cross-talk signals from adjacent spark plug wires.

Other features, attainments, and advantages will become apparent to those skilled in the art upon a reading of the following description when taken in conjunction with the accompanying drawings.

DETAILED DESCRIPTION OF THE INVENTION

Figure 1:
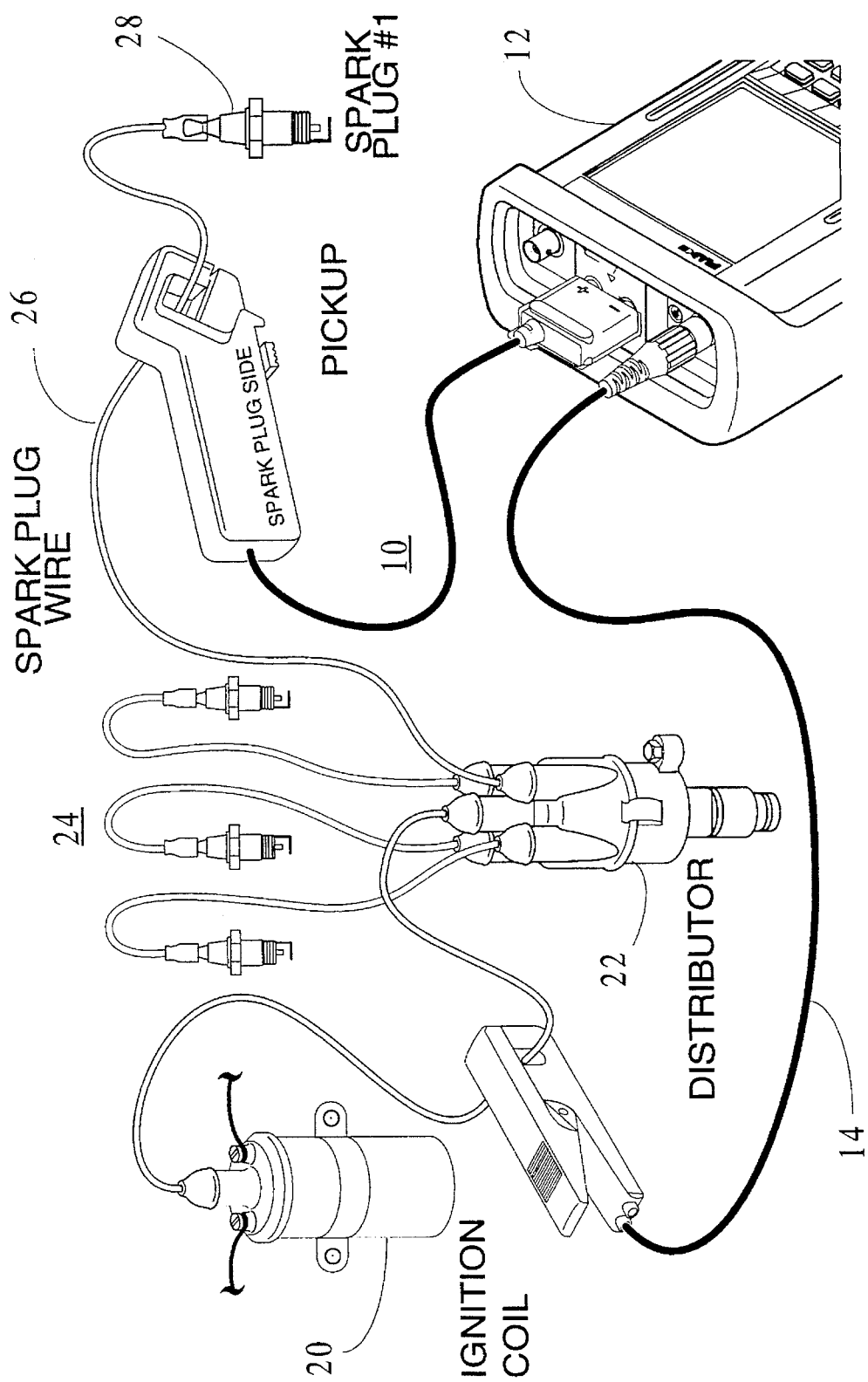
FIG. 1 is an illustration (not to scale) of an inductive pickup sensor applied in a high voltage ignition system of a typical internal combustion engine.

In FIG. 1, there is shown an illustration (not to scale) of an inductive pickup sensor 10 as applied in a high voltage ignition system of an internal combustion engine to provide trigger pulses for a test instrument 12 (partially shown). An ignition coil 20 produces a series of very short duration high voltage pulses, typically in the range of 12,000 to 20,000 volts peak. The high voltage pulses are coupled to a distributor 22 which may consist of a mechanical rotor or an electronic distributorless ignition system (DIS) which sequentially distributes the high voltage pulses to each of a set of spark wires 24 which are in turn coupled to a set of spark plugs. A selected spark plug wire 26 of the set of spark plug wires 24 is coupled to a designated spark plug 28 which is typically in cylinder number one of the internal combustion engine which is often chosen to determine the beginning of each cycle of the engine.

The spark signal received from the spark plug wire 26 is thus used to synchronize the test instrument 12 to each cycle of the internal combustion engine. By synchronizing the test instrument 12 with the trigger pulses in this manner, other measurements of the engine's timing and ignition parameters such as dwell angle may be made by the instrument 12, such as with a probe 14 which is shown as an example in FIG. 1.

Figure 2:
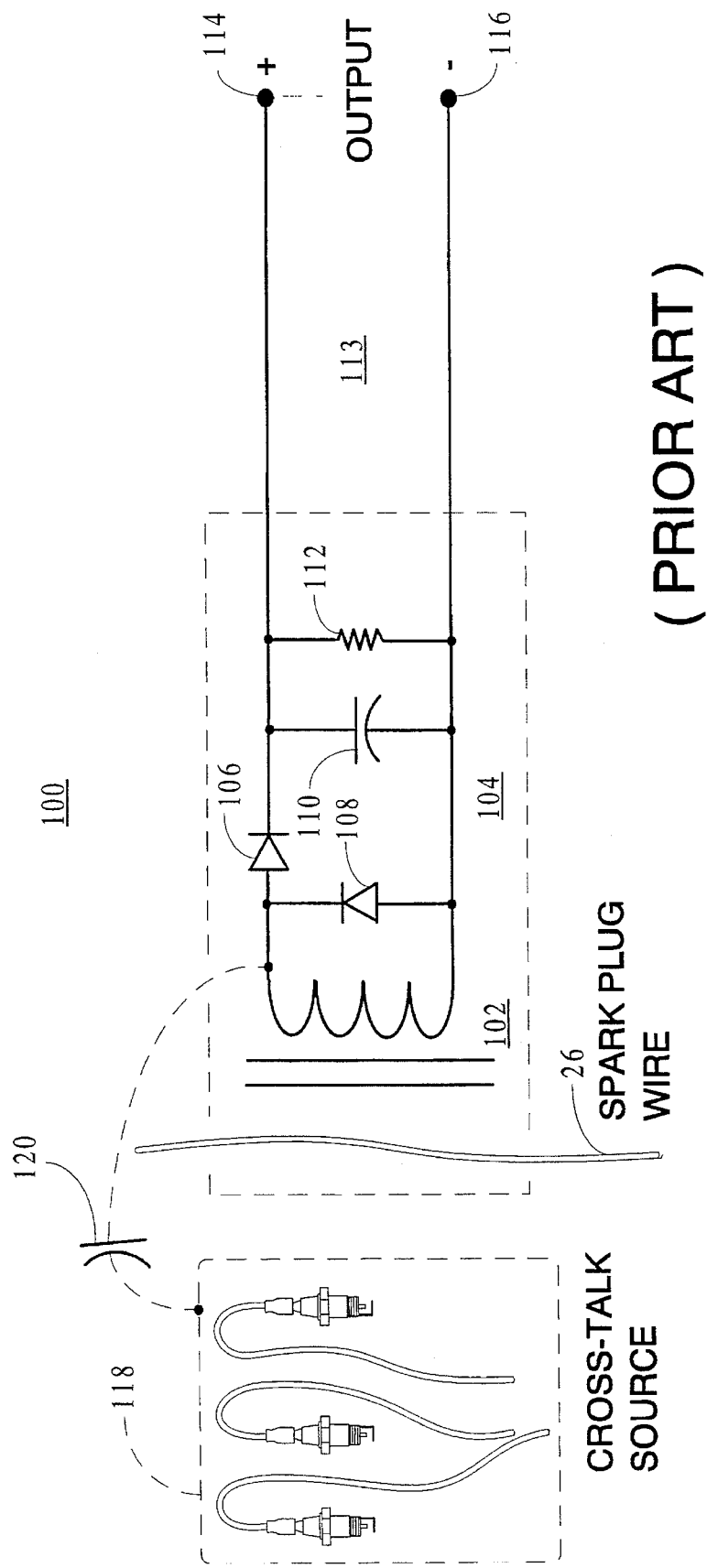
FIG. 2 is schematic diagram of an inductive pickup sensor according to the prior art.

FIG. 2 is a schematic diagram of an inductive pickup sensor 100 according to the prior art. An inductive pickup coil 102 is inductively coupled to the spark plug wire 26 to develop a spark signal. The spark signal is coupled to a detector circuit 104 comprising a detector diode 106, a polarity diode 108, and a low-pass filter formed by a capacitor 110 and a resistor 112. The spark signal is rectified by the detector diode 106 and low pass filtered by the capacitor 110 and the resistor 112 to develop the trigger signal at output terminals 114 and 116. The polarity diode 108 ensures that the trigger signal is developed in one polarity only and that no trigger signal is developed when the inductive pickup sensor 100 is placed on the spark plug wire 26 in an incorrect orientation. The output terminals 114 and 116 may then be coupled to the test instrument 12 in the form of a standard connector such as a pair of banana plugs.

A cross-talk source 118, corresponding to the high voltage pulse that is occurring in the remaining spark plug wires of the set of spark plug wires 24, induces a cross-talk signal that is capacitively coupled to the detector 104 via the capacitor 120. Capacitor 120 is not a physical capacitor but is a circuit model which represents the effective capacitance between the cross-talk source 118 and the inductive pickup sensor 100. The value of the capacitor 120, and the corresponding amplitude of the cross-talk signal present at the detector 104, varies according to the physical proximity and orientation of the inductive pickup sensor 100 to any of the spark plug wires of the cross-talk source 118. Because the detector 104 cannot distinguish between the cross-talk signal and the spark signal, any cross-talk signal that is comparable in amplitude to the spark signal may cause false trigger signals to be generated across the output connectors 114 and 116.

Figure 3:
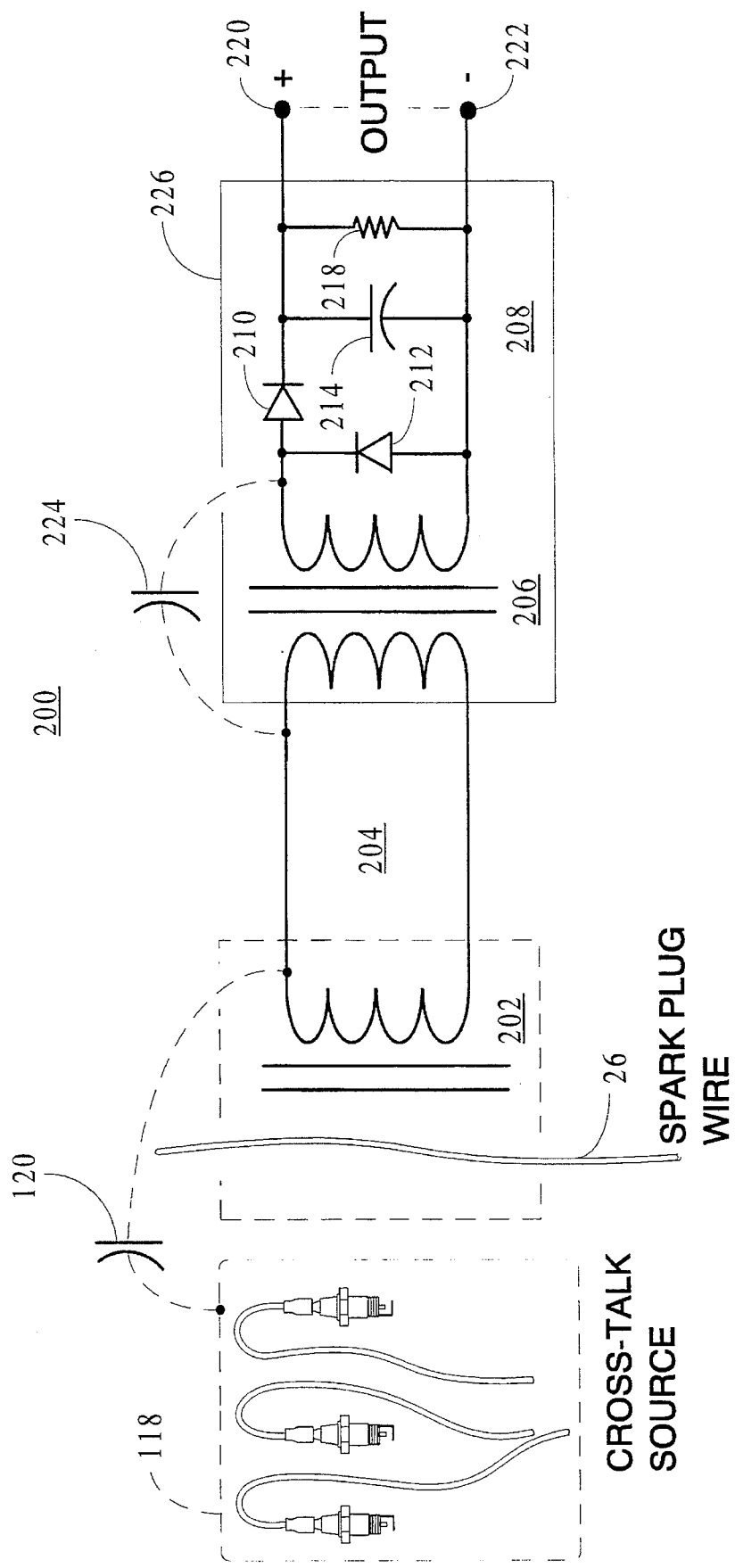
FIG. 3 is a schematic diagram of an inductive pickup sensor with enhanced immunity to cross-talk according to the present invention.

FIG. 3 is a schematic diagram of an inductive pickup sensor 200 according to the present invention. An inductive pickup coil 202 is inductively coupled to the spark plug wire 26 to develop a spark signal. The spark signal is coupled via a pair of lead wires 204 to a primary winding of an isolation transformer 206. The primary winding is magnetically coupled to a secondary winding to transfer the spark signal. The primary and secondary windings of the isolation transformer 206 are separated by a physical distance that is substantial enough to cause the interwinding capacitance between the primary and secondary windings to assume a relatively small value. Because the spark signal is magnetically coupled via magnetic core material, variations in distance do not substantially affect the level of the spark signal induced across the secondary winding. The distance thus determines the value of the interwinding capacitance and the corresponding level of cross-talk immunity. In the present invention, the distance was empirically chosen to be 5 millimeters to obtain sufficient rejection of cross-talk signals.

The secondary winding is coupled to a detector circuit 208 comprising a detector diode 210, a polarity diode 212, and a low-pass filter formed by a capacitor 214 and a resistor 218. The spark signal is rectified by the detector diode 210 and low pass filtered by the capacitor 214 and the resistor 218 to develop the trigger signal across output terminals 220 and 222. The polarity diode 212 ensures that the trigger signal is developed in one polarity only and that no trigger signal is developed when the inductive pickup sensor 200 is placed on the spark plug wire 26 in an incorrect orientation. The output terminals 220 and 222 may then be coupled to the test instrument 12 in the form of a standard connector such as a pair of banana plugs.

The cross-talk source 118, corresponding to the high voltage pulse that is occurring in the remaining spark plug wires of the set of spark plug wires 24, induces the cross-talk signal that is capacitively coupled to the inductive pickup coil 202 via the capacitor 120. As in the prior art example of FIG. 2, capacitor 120 is not a physical capacitor but is a circuit model which represents the capacitance between the cross-talk source 118 and the inductive pickup sensor 200. The value of the capacitor 120, and the corresponding amplitude of the cross-talk signal induced at the inductive pickup coil 202, varies according to the physical proximity and orientation of the inductive pickup sensor 200 to any of the spark plug wires of the cross-talk source 118.

With the addition of the isolation transformer 206 between the capacitor 120 and the detector 208, an additional series capacitance is introduced in the path of the cross-talk signal which is an interwinding capacitance between the primary and secondary windings. The interwinding capacitance is modeled by a capacitor 224 as shown in FIG. 3. The effective capacitance ($C_{eff}$) of in the path of the cross-talk signal from the cross-talk source 118 to the detector 208 is now governed by the series combination of the capacitors 120 and 224 as follows:

$$C_{eff} = \frac{C_1 \cdot C_2}{C_1 + C_2}$$

where

C1 is the capacitance value of the capacitor 120; and

C2 is the capacitance value of the capacitor 224. The level of immunity to the cross-talk signal may now be determined by setting an appropriate width of the gap between the primary and secondary windings of the isolation transformer 206 to determine an appropriate level of interwinding capacitance.

To further enhance the immunity of the inductive pickup sensor 200 to cross-talk signals, it may be desirable to introduce an electrostatic shield 226 around the lead wires 204, the transformer 206, and the detector 208. The electrostatic shield 226 may be implemented according to techniques known in the art. The electrostatic shield 226 may then be coupled to a ground terminal of the automobile electrical system.

It will be obvious to those having ordinary skill in the art that many changes may be made in the details of the above described preferred embodiments of the invention without departing from the spirit of the invention in its broader aspects. For example, the detector circuit may appear in a number of different configurations but with the common function of converting the spark signal into a trigger signal having suitable time and amplitude properties to function as a trigger signal for the instrument 12. The location of the isolation transformer 206 within the inductive pickup sensor 200 is not critical as long as there is enough physical separation between the transformer 206 and the cross-talk source 118 to prevent a substantial capacitance path forming directly to the secondary winding. Therefore, the scope of the present invention should be determined by the following claims.

What I claim as my invention is:

1. An inductive pickup sensor with enhanced immunity to cross-talk comprising:

(a) an inductive pickup coil for inductively receiving a spark signal from a selected spark plug wire while capacitively receiving a cross-talk signal from a cross-talk source;

(b) an isolation transformer having a primary winding and a secondary winding, said primary winding coupled to said inductive pickup coil wherein said spark signal is inductively coupled to said secondary winding and said cross-talk signal is capacitively coupled to said secondary winding;

(c) a detector coupled to said secondary winding for converting said spark signal into a trigger signal wherein the amplitude of said cross-talk signal at said detector is reduced to obtain a desired amount of cross-talk immunity by setting an appropriate distance between said primary winding and said secondary winding; and (d) a pair of terminals for coupling said trigger signal to a test instrument.

2. An inductive pickup sensor with enhanced immunity to cross-talk according to claim 1 further comprising an electrostatic shield enclosing said isolation transformer and said detector to reduce the amplitude of said cross-talk signal at said detector.

3. An inductive pickup sensor with enhanced immunity to cross-talk comprising:

(a) an inductive pickup coil for inductively receiving a spark signal from a selected spark plug wire while capacitively receiving a cross-talk signal from a cross-talk source;

(b) an isolation transformer having a primary winding and a secondary winding, said primary winding coupled to said inductive pickup coil wherein said spark signal is inductively coupled to said secondary winding and said cross-talk signal is capacitively coupled to said secondary winding;

(c) a detector coupled to said secondary winding for converting said spark signal into a trigger signal;

(d) an electrostatic shield enclosing said isolation transformer and said detector wherein the amplitude of said cross-talk signal at said detector is reduced to obtain a desired amount of cross-talk immunity by setting an appropriate distance between said primary winding and said secondary winding and by using said electrostatic shield; and (e) a pair of terminals for coupling said trigger signal to a test instrument.

* * * * *